(12) United States Patent
Suzuki

(10) Patent No.: US 11,840,010 B2
(45) Date of Patent: Dec. 12, 2023

(54) PATTERN FORMING METHOD, IMPRINT APPARATUS, AND ARTICLE MANUFACTURING METHOD

(71) Applicant: CANON KABUSHIKI KAISHA, Tokyo (JP)

(72) Inventor: Ryohei Suzuki, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 90 days.

(21) Appl. No.: 17/350,474

(22) Filed: Jun. 17, 2021

(65) Prior Publication Data
US 2021/0394429 A1    Dec. 23, 2021

(30) Foreign Application Priority Data
Jun. 22, 2020    (JP) .................................. 2020-107094

(51) Int. Cl.
  *B29C 59/00*    (2006.01)
  *B29C 59/02*    (2006.01)
  *B81C 1/00*    (2006.01)

(52) U.S. Cl.
  CPC .......... *B29C 59/002* (2013.01); *B29C 59/022* (2013.01); *B29C 59/026* (2013.01); *B81C 1/0046* (2013.01); *B29C 2059/023* (2013.01)

(58) Field of Classification Search
  CPC .... B29C 2043/3605; B29C 2043/3602; B29C 51/265; B29C 51/261; B29C 51/10
  See application file for complete search history.

(56) References Cited

U.S. PATENT DOCUMENTS

| | | | |
|---|---|---|---|
| 2010/0096774 A1* | 4/2010 | Kruijt-Stegeman ... | B82Y 40/00 425/436 R |
| 2016/0016353 A1* | 1/2016 | Yamamoto ............ | G03F 7/0002 425/150 |
| 2016/0031151 A1* | 2/2016 | Tan ....................... | B29C 59/026 264/293 |
| 2016/0039143 A1* | 2/2016 | Nakagawa ............. | B82Y 10/00 264/293 |

FOREIGN PATENT DOCUMENTS

| JP | 2010098310 A | 4/2010 |
|---|---|---|
| JP | 5084823 B2 | 11/2012 |

* cited by examiner

*Primary Examiner* — Austin Murata
(74) *Attorney, Agent, or Firm* — Canon U.S.A., Inc., IP Division

(57) ABSTRACT

A pattern forming method of forming, with a mold, a pattern on a substrate held by a substrate holding unit capable of changing a holding force for each holding region includes setting, with a plurality of shot regions corresponding to a first holding region as a target for pattern formation, a first holding force in the first holding region smaller than a second holding force in a second holding region different from the first holding region, coating, with an imprint material, a region including the plurality of shot regions corresponding to the first holding region, and forming the pattern on the substrate by bringing the imprint material, with which the plurality of shot regions corresponding to the first holding region is coated, and the mold in contact with each other.

11 Claims, 9 Drawing Sheets

PATTERN FORMING METHOD, IMPRINT APPARATUS, AND ARTICLE MANUFACTURING METHOD

BACKGROUND OF THE INVENTION

Field of the Invention

The present disclosure relates to a pattern forming method, an imprint apparatus, and an article manufacturing method.

Description of the Related Art

As a new pattern forming technology for manufacture of semiconductor devices, imprint technology has attracted attention. An imprint apparatus cures an imprint material on a substrate, such as a silicon wafer or a glass plate, with a mold in contact with the imprint material, and separates the mold from the cured imprint material, resulting in formation of a pattern of the imprint material on the substrate.

A conventional imprint apparatus repeatedly performs, for each shot region of a substrate, a coating step of coating the substrate with an imprint material, a contact step of bringing the imprint material and a mold in contact with each other, a curing step of curing the imprint material, and a mold releasing step of separating the mold from the imprint material. However, in recent years, for an improvement in throughput, a pattern forming method has been studied, in which a plurality of shot regions is coated with an imprint material, and a pattern is formed to each shot region, successively.

Japanese Patent No. 5084823 discusses a sequence called multi-field dispensing in which an imprint material is coated on a plurality of shot regions adjacent on a substrate or all shot regions on the substrate, and then a contact step, a curing step, and a mold releasing step are performed for each shot region.

In order to improve the accuracy of alignment between a mold and a shot region, releasing distortion due to holding of a substrate has been known. Japanese Patent Application Laid-Open No. 2010-98310 discusses a substrate holding unit capable of changing a holding force for each region, by which the holding force at a position corresponding to a shot region as a target for pattern formation is reduced to cause release of distortion occurring in the substrate.

In the multi-field dispensing described above, after pattern formation to a first shot region and before pattern formation to a second shot region next to the first shot region, in some cases, release of distortion is required. To release distortion, a reduction in a holding force is required. In addition, the reduction in the holding force requires time. Accordingly, releasing distortion from the substrate in the multi-field dispensing is likely to cause deterioration in productivity.

SUMMARY OF THE INVENTION

A pattern forming method of forming, with a mold, a pattern on a substrate held by a substrate holding unit capable of changing a holding force for each holding region includes setting, with a plurality of shot regions corresponding to a first holding region as a target for pattern formation, a first holding force in the first holding region smaller than a second holding force in a second holding region different from the first holding region, coating, with an imprint material, a region including the plurality of shot regions corresponding to the first holding region, and forming the pattern on the substrate by bringing the imprint material, with which the plurality of shot regions corresponding to the first holding region is coated, and the mold in contact with each other.

Further features of the present disclosure will become apparent from the following description of exemplary embodiments with reference to the attached drawings.

DESCRIPTION OF THE EMBODIMENTS

Figure 1:
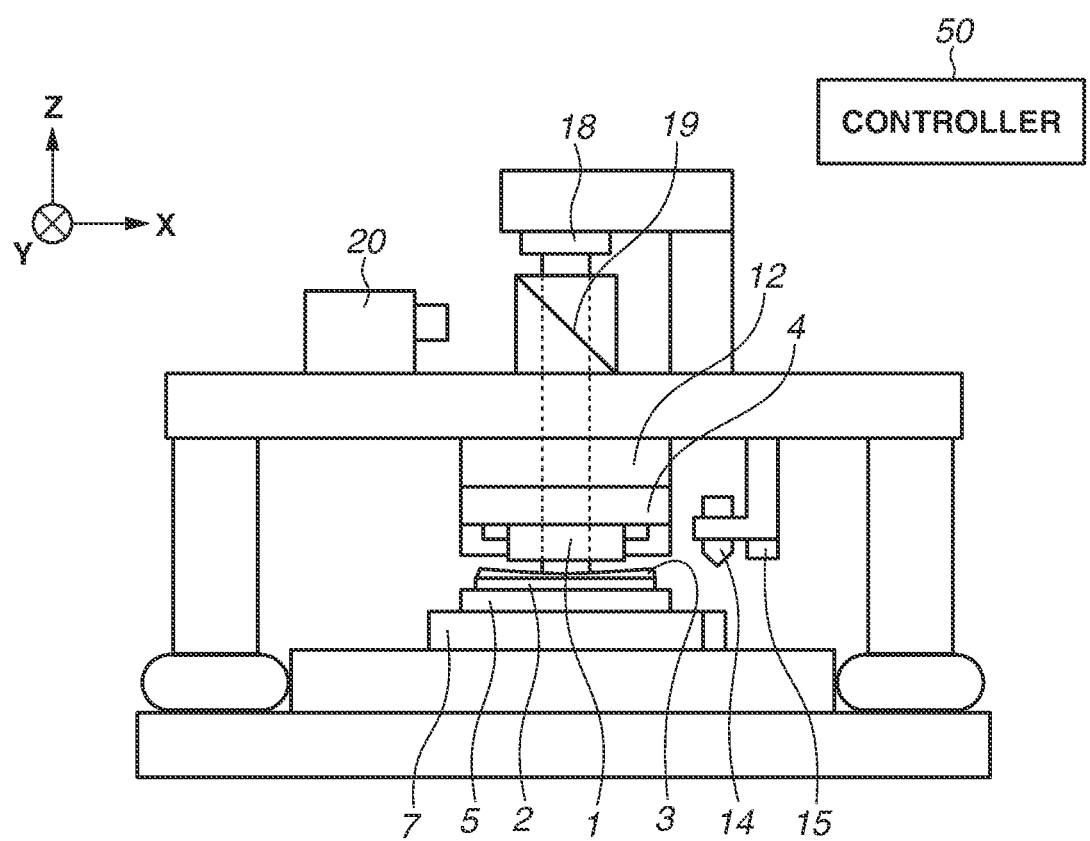
FIG. 1 illustrates a configuration of an imprint apparatus.

Exemplary embodiments of the present disclosure will be described in detail below with reference to the accompanying drawings. The invention according to the scope of the claims is not limited to the following exemplary embodiments. A plurality of features is given in the exemplary embodiments. However, not all the plurality of features is necessarily essential. In addition, the plurality of features can be combined appropriately. Furthermore, in the accompanying drawings, the same or similar constituents are denoted with the same reference numerals, and thus the duplicate descriptions thereof will be omitted.

An overview of an imprint apparatus according to an exemplary embodiment will be given. The imprint apparatus brings an imprint material supplied on a substrate and a mold in contact with each other, and applies energy for curing to the imprint material to form a pattern of a cured object to which a relief pattern (i.e., a pattern having recessed portions and protruding portions) of the mold is transferred.

As the imprint material, a curable composition that is cured due to application of energy for curing is used. As the energy for curing, for example, electromagnetic waves or heat can be used. Examples of the electromagnetic waves include light having a wavelength selected from a range from 10 nm to 1 mm, specifically, infrared rays, visible light, and ultraviolet rays. Examples of the curable composition include a composition that is cured due to irradiation of light and a composition that is cured due to heating.

Such a photo-curing composition that is cured due to irradiation of light contains at least a polymerizable compound and a photopolymerization initiator. As necessary, the photo-curing composition can further contain a non-polymerizable compound or a solvent. The non-polymerizable compound is of at least one type selected from the group consisting of a sensitizer, a hydrogen donor, an internal addition type mold release agent, a surfactant, an antioxidant, and a polymer component.

As a material of the substrate, for example, glass, ceramic, metal, a semiconductor, or resin can be used. As necessary, a surface of the substrate can be provided with a member different in material from the substrate. Examples of the substrate include a silicon wafer, a compound semiconductor wafer, and a piece of quartz glass.

FIG. 1 illustrates a configuration of the imprint apparatus according to the present exemplary embodiment. The imprint apparatus adopts, in the present exemplary embodiment, a photo-curing method of curing an imprint material by irradiation of ultraviolet rays. However, the imprint apparatus is not limited to this method, and thus can adopt, for example, a thermal curing method of curing an imprint material by a heat input.

The imprint apparatus molds an imprint material on a substrate with a mold having a pattern. As illustrated in FIG. 1, a substrate holding unit 5 is arranged on a substrate stage 7, and a substrate 2 is suction-held on the substrate holding unit 5. An alignment mark provided on the substrate 2 is observed by an alignment optical system (not illustrated), resulting in acquisition of positional deviation information on the substrate 2. A height measurement device 15 measures a distance from the height measurement device 15 to an upper surface of the substrate 2.

A mold 1 is held by a mold holding unit 4. A relative height between a pattern surface of the mold 1 and the height measurement device 15 is measured in advance, so that a distance from the upper surface of the substrate 2 to the pattern surface of the mold 1 can be calculated. A dispenser 14 supplies an imprint material 3 as a photo-curing resin onto the substrate 2. A driving unit 12 lowers the mold 1 to make contact with the imprint material 3 supplied on the substrate 2, so that the imprint material 3 flows into a patterned groove. The mold 1 is formed of material transparent to light (ultraviolet rays) that cures the imprint material 3.

The ultraviolet rays emitted from a light source 20 are reflected by a half mirror 19 to enter the imprint material 3 on the substrate 2 through the mold 1. Thus, the imprint material 3 irradiated with the ultraviolet rays is cured. After that, the driving unit 12 raises the mold 1 such that the mold 1 is separated from the cured imprint material 3, so that an inverse pattern to the pattern of the mold 1 is formed on the substrate 2. An observation optical system 18 serves as a scope that observes a shot region on the substrate 2. The observation optical system 18 is used to verify a state of imprint processing, such as a state of imprinting of the mold 1 or a state of filling of the imprint material 3 to the mold 1. A controller 50 performs overall control of each unit regarding the imprint processing.

The driving unit 12 described above has a mechanism of raising and lowering the mold 1 with respect to the substrate 2. However, the driving unit 12 is required at least to have a mechanism of relatively changing the interval between the mold 1 and the substrate 2. For example, provided can be a mechanism of raising and lowering the substrate 2 with respect to the mold 1 or provided can be a mechanism of raising and lowering the mold 1 and the substrate 2 individually.

Figure 2:
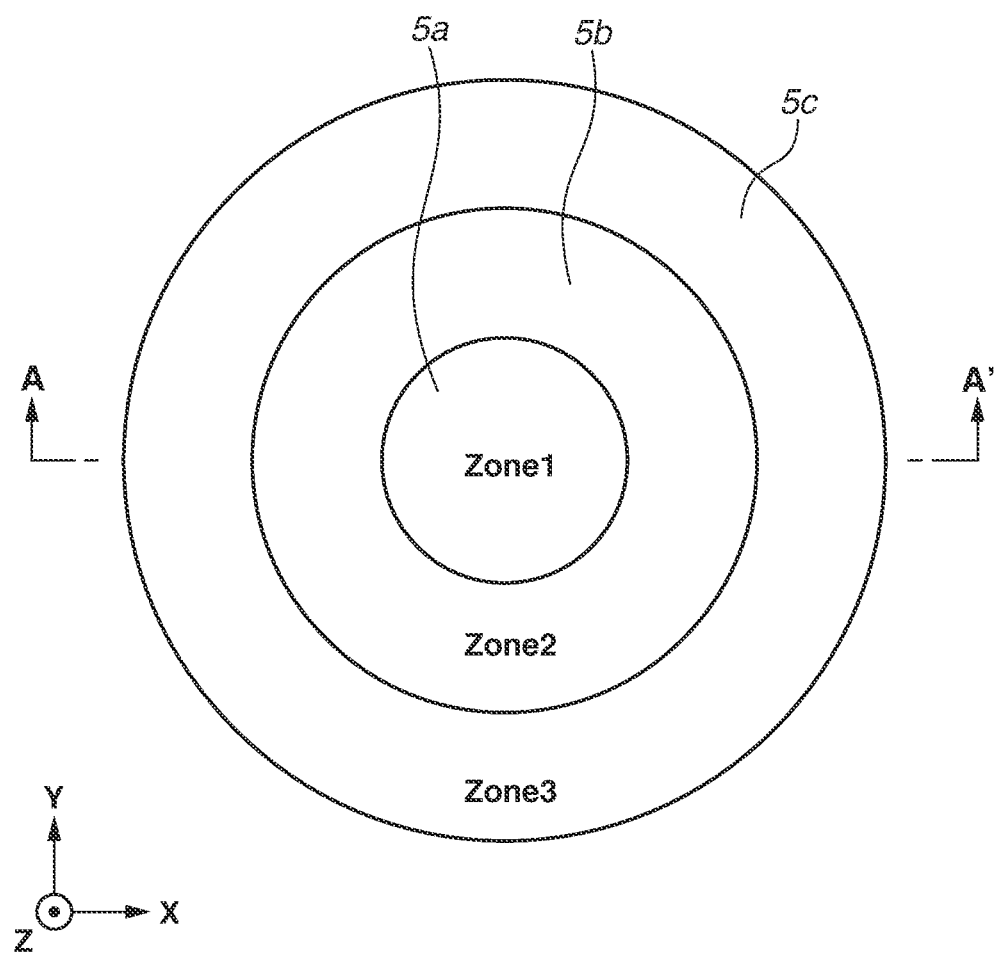
FIG. 2 illustrates an upper surface of a substrate holding unit.

The substrate holding unit 5 holds the substrate 2, for example, by vacuum suction. FIG. 2 illustrates the substrate holding unit 5 viewed from a side of the mold 1. As illustrated in FIG. 2, the substrate holding unit 5 has a plurality of suction regions (holding regions) 5a to 5c, concentrically, on a surface that contacts with the substrate 2. Regions of the substrate 2 corresponding to the suction regions 5a, 5b, and 5c are defined as Zone 1, Zone 2, and Zone 3, respectively.

Figure 3:
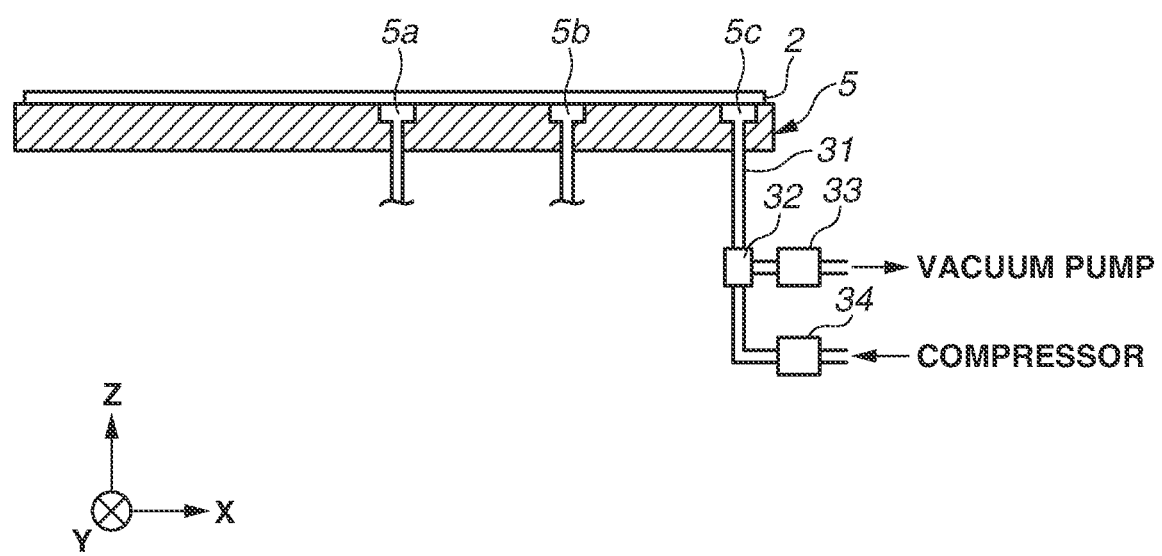
FIG. 3 illustrates a detailed configuration of the substrate holding unit.

FIG. 3 is a sectional view taken along a line A-A' of FIG. 2. The plurality of suction regions 5a to 5c is each connected to a pneumatic adjustment mechanism. In FIG. 3, connection configurations corresponding to the suction regions 5a and 5b are omitted in illustration. Herein, the suction region 5c will be described representatively. The suction region 5c is connected to a pipe 31. The pipe 31 branches into two on the way through a flow-path switching valve 32. One of the two is connected to a vacuum pump not illustrated through a regulator 33, and the other is connected to a compressor not illustrated through a regulator 34.

For suction-holding of the substrate 2, the controller 50 switches the flow-path switching valve 32 to a vacuum-pump side. Thus, the air in the suction region 5c is sucked to the vacuum pump through the pipe 31, the flow-path switching valve 32, and the regulator 33, resulting in negative pressure in the suction region 5c. Thus, the substrate 2 is sucked. In this case, the regulator 33 can control a suction force (the force of sucking the substrate 2, namely, a holding force of holding the substrate 2 that the substrate holding unit 5 has) under the control of the controller 50.

For release of the suction-holding of the substrate 2, the controller 50 switches the flow-path switching valve 32 to a compressor side. Thus, the air from the compressor is supplied to the suction region 5c through the regulator 34, the flow-path switching valve 32, and the pipe 31, resulting in positive pressure in the suction region 5c. Thus, the substrate 2 separates from the substrate holding unit 5.

The other suction regions 5a and 5b are similar in configuration, and thus the descriptions thereof will be omitted. As above, the substrate holding unit 5 according to the present exemplary embodiment is capable of controlling, individually, the suction forces in the plurality of suction regions 5a to 5c.

Figure 4:
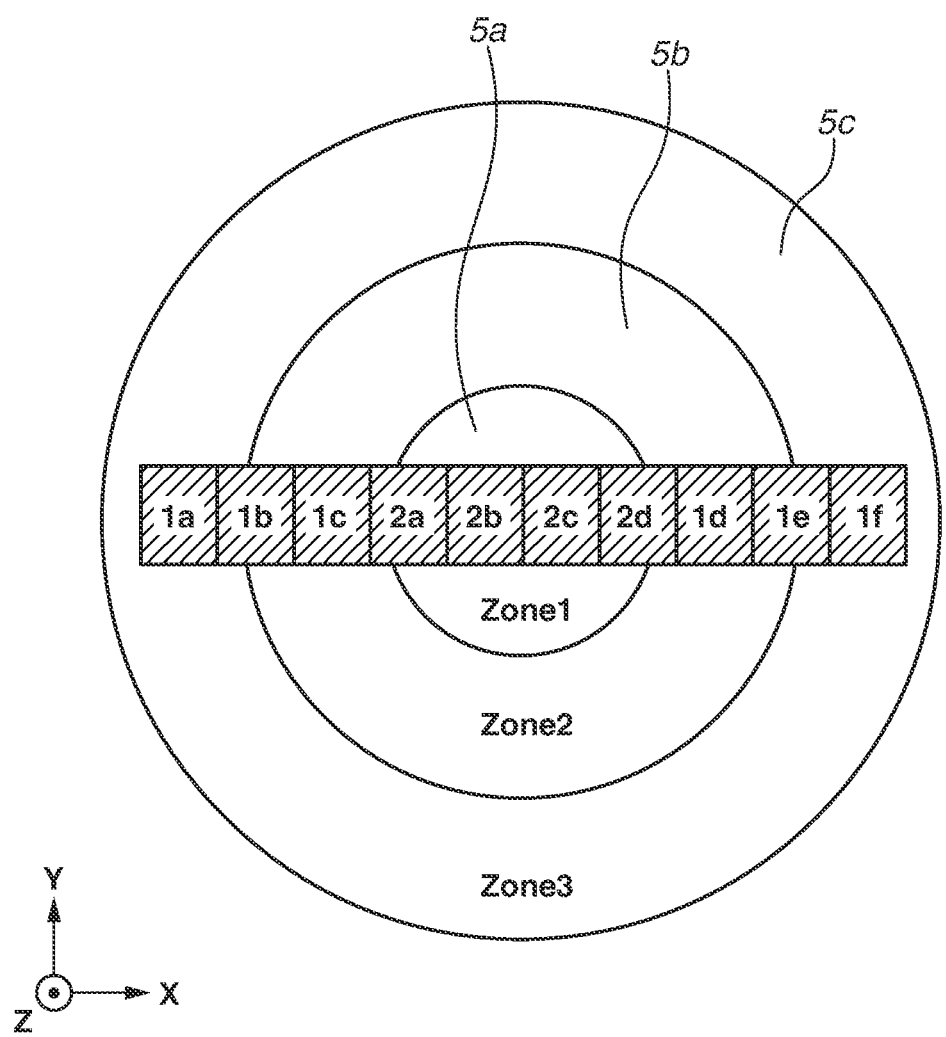
FIG. 4 illustrates an arrangement of shot regions on a substrate according to a first exemplary embodiment.

An arrangement of shot regions on a substrate and grouping thereof in a first exemplary embodiment will be described with reference to FIG. 4. In FIG. 4, a plurality of shot regions (1a to 1f and 2a to 2d) is arrayed in a row on the substrate. The shot regions 1a to 1f are defined as belonging to a group 1, and the shot regions 2a to 2d are defined as belonging to a group 2. In FIG. 4, the shot regions 1a to 1f belonging to the group 1 are located in a region including Zone 2 and Zone 3. The shot regions 1a and 1f are arranged in Zone 3. The shot regions 1c and 1d are arranged in Zone 2. The shot regions 1b and 1e are arranged across Zone 2 and Zone 3. The shot regions 2a to 2d belonging to the group 2 are located in a region including Zone 1 and Zone 2. The shot regions 2b and 2c are arranged in Zone 1, and the shot regions 2a and 2d are arranged across Zone 1 and Zone 2.

In the present exemplary embodiment, pattern formation is performed on the basis of a multi-field dispensing technique in which a plurality of shot regions adjacent on a substrate is coated with an imprint material and then pattern formation is performed for each shot region. A flow of sequential pattern formation to the shot regions 1a to 1f belonging to the group 1 and the shot regions 2a to 2d belonging to the group 2 will be described with a flowchart of FIG. 5. The controller 50 performs control indicated in the flowchart of FIG. 5 based on a control program as a computer program.

Figure 5:
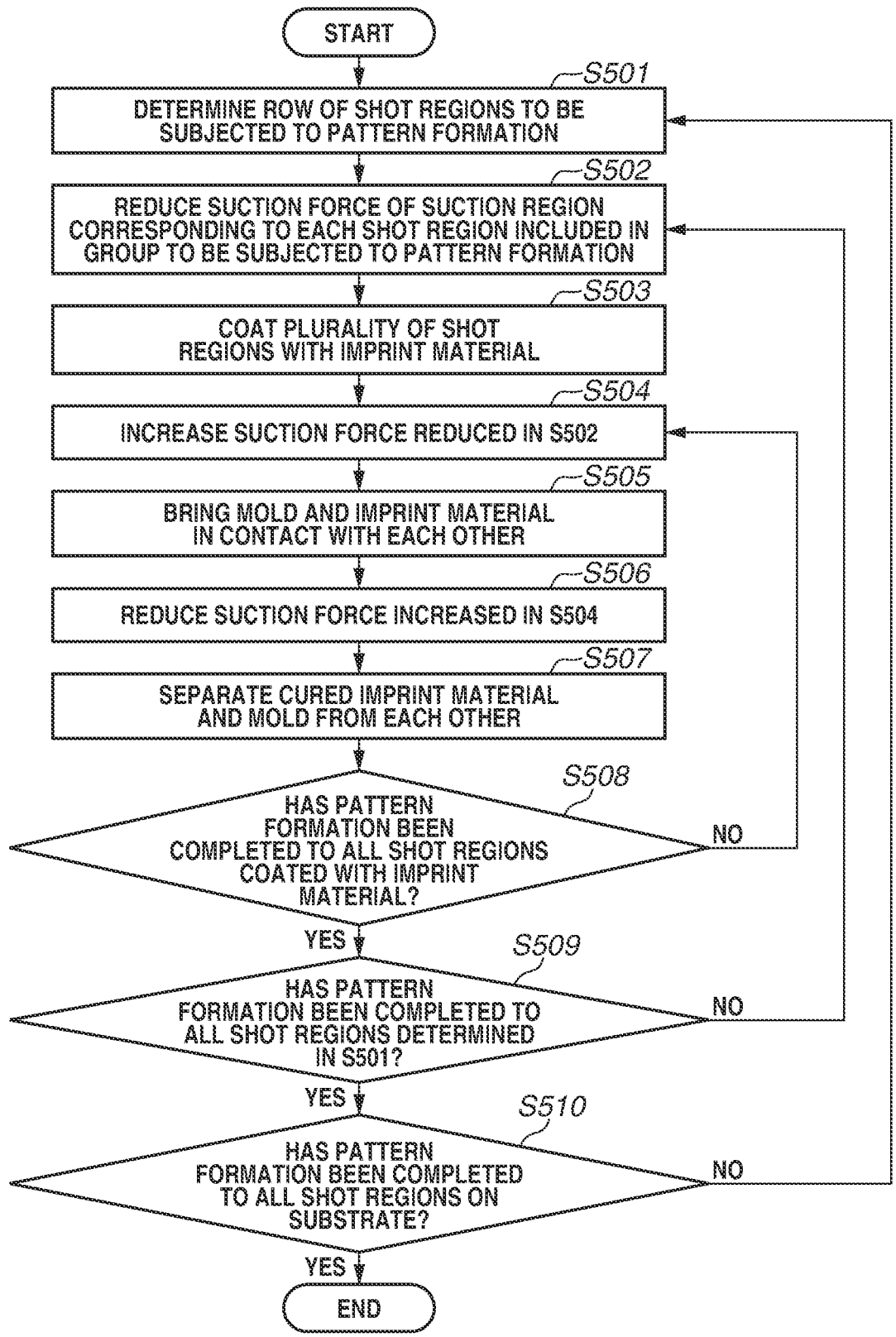
FIG. 5 is a flowchart of pattern formation according to the first exemplary embodiment.

In step S501 of FIG. 5, a row of shot regions to be subjected to pattern formation on a substrate 2 is determined. Here, the plurality of shot regions (1a to 1f and 2a to 2d)

illustrated in FIG. 4 is determined as the row of shot regions. The shot regions in the group 1 are the first target to be subjected to pattern formation. Thus, in step S502, a reduction is made in the suction force (a first holding force) of each of the suction regions 5b and 5c in which the shot regions 1a to 1f belonging to the group 1 are located (a first holding region). The suction force in this case is regarded as a first value that is, for example, approximately −5 kPa. Thus, the suction force (a second holding force) of the suction region 5a (a second holding region) other than the suction regions 5b and 5c is larger than the first holding force.

Reduction in the suction force of each of the suction regions 5b and 5c enables release of distortion remaining in Zones 2 and 3 of the substrate 2. Rendering the pressures of the suction regions 5b and 5c zero enables effective distortion release. Application of weak negative pressure to the suction regions 5b and 5c enables achievement of the distortion release while preventing the substrate 2 from positional deviation.

In step S503, the shot regions 1a to 1f belonging to the group 1 are coated with the imprint material 3. At the time of coating of the imprint material 3, an operation of relatively driving the substrate 2 and the dispenser 14 is also performed. For example, the shot regions 1a to 1f are coated with the imprint material 3 by the dispenser 14 with the substrate stage 7 being moved in an X-axis direction in FIG. 1. The shot regions 1a to 1f can be collectively coated with the imprint material 3 using a plurality of dispensers 14. Alternatively, the operation in step S503 can be performed simultaneously with the operation in step S502.

After the shot regions 1a to 1f are coated with the imprint material 3, in step S504, an increase is made in the suction force of each of the suction regions 5b and 5c in which the shot regions 1a to 1f are located. As described above, the suction force in step S502 is regarded as the first value, and the suction force in step S504 is set to a second value that is larger than the first value. After that, in step S505, the imprint material 3 supplied on the substrate 2 and the mold 1 are brought in contact with each other.

Increase in the suction force of each of the suction regions 5b and 5c in step S504 enables reduction of a possible positional deviation of the substrate 2 at the time of contact of the imprint material 3 and the mold 1. After that, in step S506, a reduction is made again in the suction force of each of the suction regions 5b and 5c. The imprint material 3 is cured, for example, with ultraviolet rays. Then, in step S507, the mold 1 is separated from the cured imprint material 3. Separation of the mold 1 with the reduced suction force of each of the suction regions 5b and 5c enables reduction of a risk of a pattern failure of the imprint material 3 at the time of mold release. The suction force in step S504 is regarded as the second value, and the suction force in step S506 is set to be a third value that is smaller than the second value.

Figure 6A:
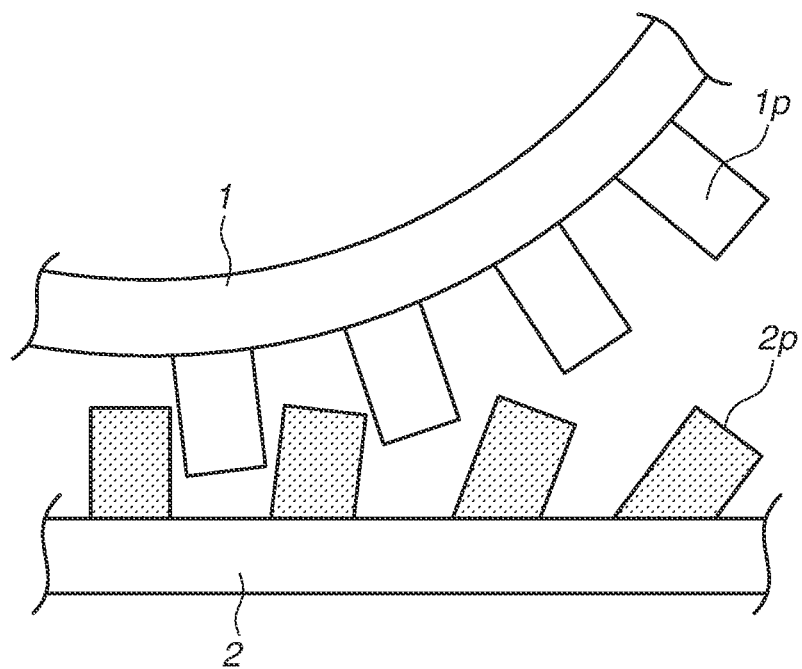
FIGS. 6A and 6B illustrate inclination in a pattern at the time of mold release.
Figure 6B:
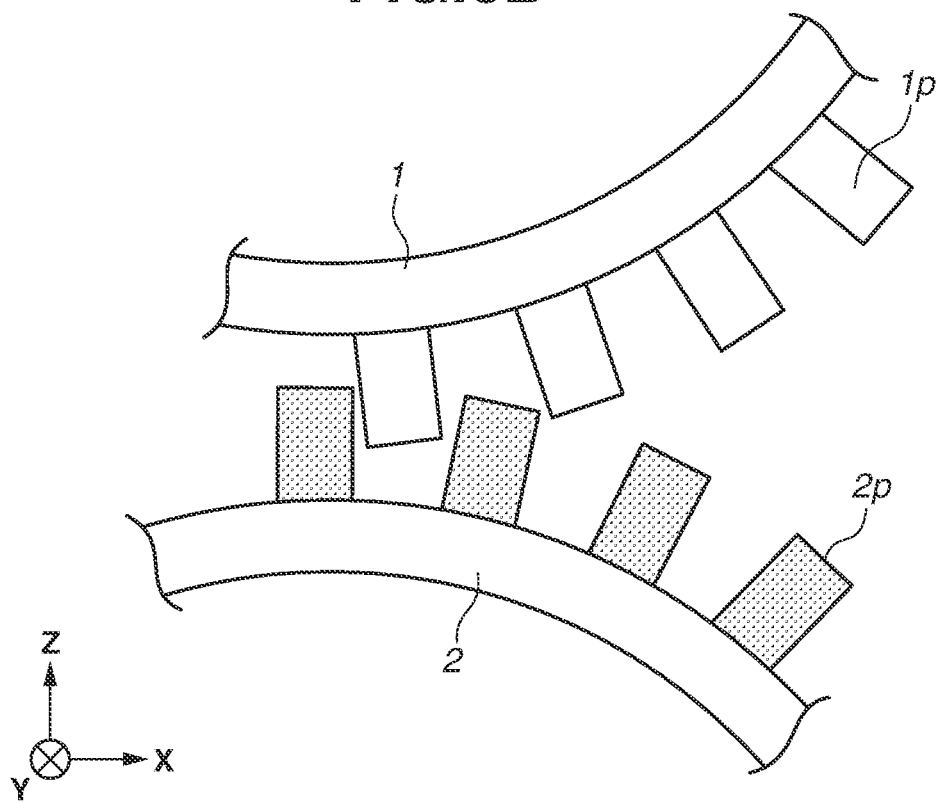

Now, the pattern failure that may occur at the time of mold release will be described with FIGS. 6A and 6B. FIGS. 6A and 6B are each an enlarged view of the mold 1 and the substrate 2 viewed in a Y-axis direction. FIGS. 6A and 6B each illustrate a pattern portion 1p formed on the mold 1 and an imprint material pattern 2p formed on the substrate 2. At the time of separation of the mold 1 from the cured imprint material, a strong force is applied to the cured imprint material so that a pattern failure of the imprint material is likely to occur. Thus, as illustrated in FIG. 6A, a technique of bending the pattern portion 1p of the mold 1 at the time of separation of the mold 1 has been known. However, only bending the pattern portion 1p causes application of a horizontal force to the imprint material pattern 2p, so that an inclination is likely to occur in the imprint material pattern 2p.

As illustrated in FIG. 6B, at the time of separation of the mold 1, bending the substrate 2 in the opposite direction to the pattern portion 1p of the mold 1 enables reduction of the horizontal force to be applied to the cured imprint material pattern 2p. Thus, a risk of a failure, such as an inclination of the imprint material pattern 2p, can be reduced.

Refer back to FIG. 5 for further description. In step S508, it is determined as to whether pattern formation has been performed to all shot regions coated with the imprint material 3. In a case where any shot region yet to be subjected to pattern formation is present (NO in step S508), the processing returns to step S504. Then, an increase is made in the suction force of each of the suction regions 5b and 5c. After that, the processing from step S505 to step S507 is performed, so that pattern formation is performed to the target shot region.

In step S508, in a case where it is determined that pattern formation has been performed to all shot regions coated with the imprint material 3 (YES in step S508), the processing proceeds to step S509. In step S509, it is determined as to whether pattern formation has been performed to all shot regions belonging to the row determined in step S501. Here, no pattern formation has been performed to the shot regions 2a to 2d belonging to the group 2 (NO in step S509). Thus, the processing returns to step S502. Then, pattern formation is performed to the shot regions 2a to 2d as a target based on the multi-field dispensing technique.

In step S509, in a case where it is determined that pattern formation has been performed to all shot regions belonging to the row determined in step S501 (YES in step S509), the processing proceeds to step S510. In step S510, it is determined as to whether pattern formation has been performed to all shot regions on the substrate 2. Here, no pattern formation has been performed to any shot regions different from those in the row determined in step S501 (NO in step S510). Thus, the processing returns to step S501. Then, a different row of shot regions is determined, and pattern formation is performed to the determined row. In step S510, in a case where it is determined that pattern formation has been performed to all shot regions on the substrate 2 (YES in step S510), the processing of pattern formation to the substrate 2 ends.

As described above, a plurality of shot regions is grouped based on the suction regions, and distortion release and pattern formation are performed for each group. Thus, an improvement can be made in the accuracy of pattern formation with suppression of reduction in throughput. For example, in FIG. 4, if distortion release and pattern formation are sequentially performed to the shot regions (1a to 1f and 2a to 2d) from the left, the number of changes in suction force increases, thereby leading to reduction in throughput.

In the first exemplary embodiment described above, a sequence has been described in which a row of shot regions to be subjected to pattern formation is determined, the shot regions included in the row are grouped, and coating of an imprint material, distortion release, and pattern formation are performed for each group. In a second exemplary embodiment, a row of shot regions to be subjected to pattern formation is determined, and then all shot regions included in the row are coated with an imprint material. In FIG. 4, the shot regions 1a to 1f belonging to the group 1 and the shot regions 2a to 2d belonging to the group 2 are coated with an imprint material.

A flow of pattern formation to one substrate will be described with a flowchart of FIG. 7. The controller 50 performs the control indicated in the flowchart of FIG. 7 based on a control program as a computer program.

Figure 7:
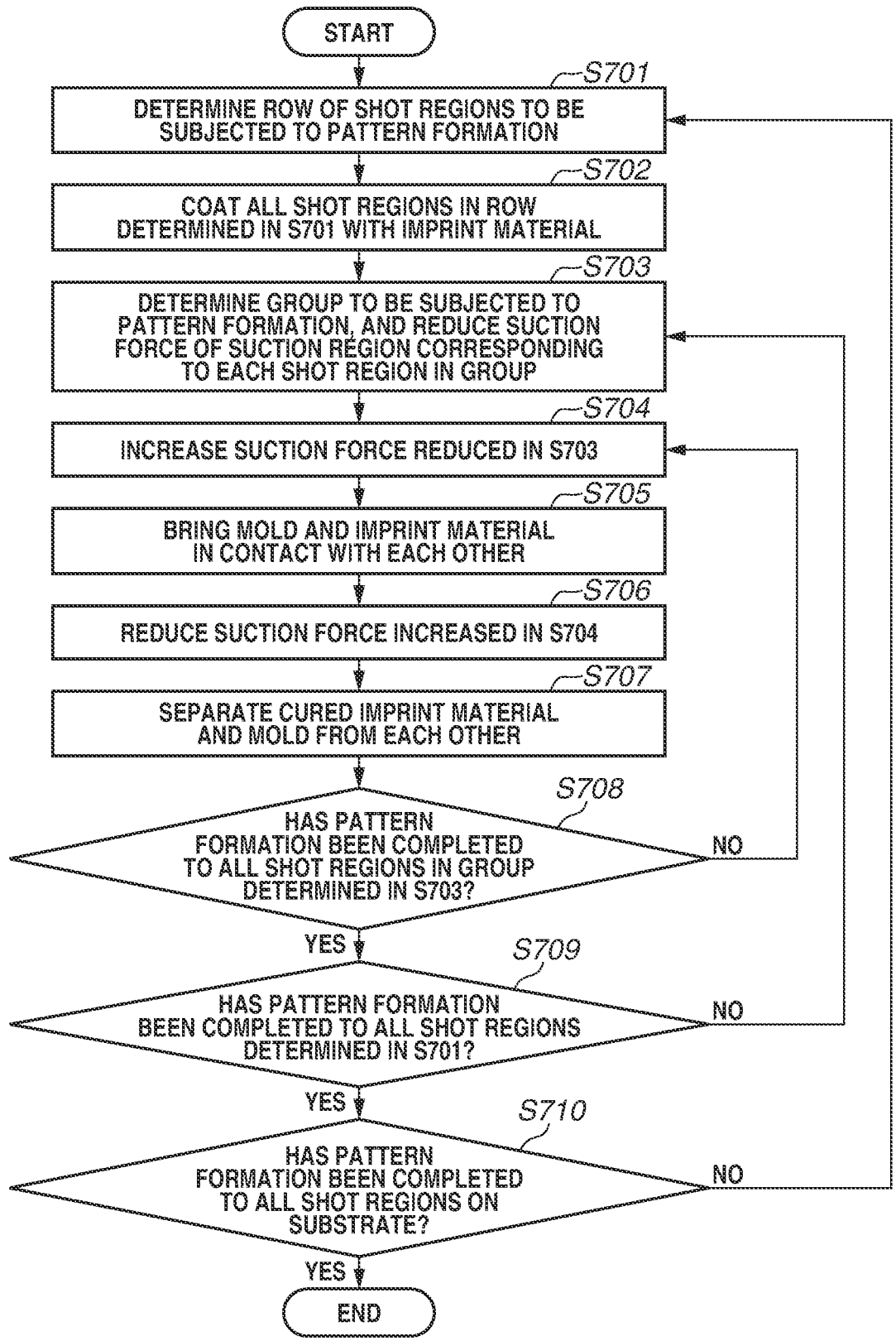
FIG. 7 is a flowchart of pattern formation according to a second exemplary embodiment.

In step S701 of FIG. 7, a row of shot regions to be subjected to pattern formation on a substrate is determined. Here, the plurality of shot regions (1a to 1f and 2a to 2d) illustrated in FIG. 4 is determined as the row of shot regions. Next, in step S702, the shot regions 1a to 1f belonging to the group 1 and the shot regions 2a to 2d belonging to the group 2 are coated with the imprint material 3.

In step S703, a group to be subjected to pattern formation is determined. Here, pattern formation to the group 1 is performed first. A reduction is made in the suction force (the first holding force) of each of the suction regions 5b and 5c in which the shot regions 1a to 1f belonging to the group 1 are located. For example, the suction force is set at approximately −5 kPa. Thus, the suction force (the second holding force) of the suction region 5a other than the suction regions 5b and 5c is larger than the first holding force.

The processing from step S704 to step S707 is similar to the processing from step S504 to step S507 in FIG. 5, and thus the description thereof will be omitted. In step S708, it is determined as to whether pattern formation has been completed to all shot regions in the group 1 determined in step S703. In a case where any shot region yet to be subjected to pattern formation is present (NO in step S708), the processing returns to step S704. Then, an increase is made in the suction force of each of the suction regions 5b and 5c. After that, the processing from step S705 to step S707 is performed, so that pattern formation is performed to the target shot region.

In step S708, in a case where it is determined that pattern formation has been performed to all shot regions in the group 1 (YES in step S708), the processing proceeds to step S709. In step S709, it is determined as to whether pattern formation has been performed to all shot regions belonging to the row determined in step S701. Here, no pattern formation has been performed to the shot regions 2a to 2d belonging to the group 2 (NO in step S709), so that the processing returns to step S703. Then, pattern formation is performed to the shot regions 2a to 2d as a target.

In step S709, in a case where it is determined that pattern formation has been performed to all shot regions belonging to the row determined in step S701 (YES in step S709), the processing proceeds to step S710. In step S710, it is determined as to whether pattern formation has been performed to all shot regions on the substrate. Here, no pattern formation has been performed to any shot regions different from those in the row determined in step S701 (NO in step S710), so that the processing returns to step S701. Then, a different row of shot regions is determined, and pattern formation is performed to the determined row. In step S710, in a case where it is determined that pattern formation has been performed to all shot regions on the substrate (YES in step S710), the processing of pattern formation to the substrate ends.

As described above, in the second exemplary embodiment, a row of shot regions to be subjected to pattern formation is determined, and then all shot regions included in the row are coated with an imprint material. Thus, the time required for coating of the imprint material can be shortened. As described with FIG. 1, the position at which coating of the imprint material 3 is performed is apart from the position at which pattern formation is performed. Thus, coating of the imprint material 3 is collectively performed, so that an improvement in throughput can be achieved.

In the first and second exemplary embodiments described above, pattern formation is performed for each row including a plurality of shot regions arrayed in the X-axis direction (a first direction). In a third exemplary embodiment, a plurality of rows arrayed in the Y-axis direction (a second direction) perpendicular to the X-axis direction is a collective target for pattern formation, thereby leading to achievement of a further improvement in throughput.

Figure 8:
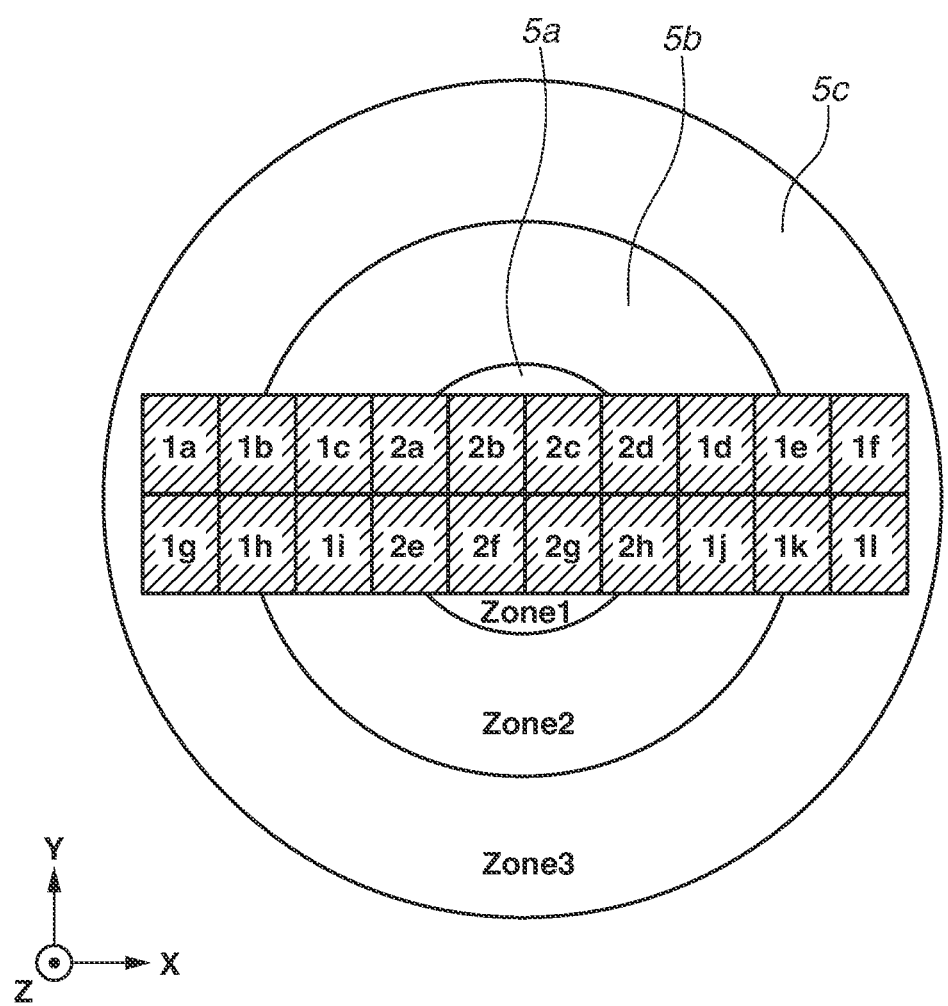
FIG. 8 illustrates an arrangement of shot regions on a substrate according to a third exemplary embodiment.

As illustrated in FIG. 8, a plurality of shot regions (1a to 1l and 2a to 2h) is located on a substrate. As described in the first exemplary embodiment, each shot region is grouped based on the suction regions, and then pattern formation is performed sequentially for each group. For example, the shot regions 1a to 1l are defined as belonging to a group 1, and the shot regions 2a to 2h are defined as belonging to a group 2. The plurality of shot regions (1a to 1l and 2a to 2h) is collectively coated with the imprint material 3, and then distortion release and pattern formation are performed sequentially for each group.

In the present exemplary embodiment, the case has been described in which two rows of shot regions are set as a target for pattern formation. However, three rows or more of shot regions can be set as a target for pattern formation. Alternatively, all shot regions on a substrate can be set as a target for pattern formation.

<Article Manufacturing Method According to Exemplary Embodiment>

An article manufacturing method according to an exemplary embodiment of the present disclosure is suitable for manufacturing an article, such as a semiconductor device, specifically, a microdevice or an element having a fine structure. The article manufacturing method according to the present exemplary embodiment includes a first step of forming a pattern to an imprint material on a substrate with an imprint apparatus and a second step of treating (processing) the substrate having the pattern formed in the first step. The manufacturing method further includes other known steps (e.g., oxidizing, film forming, vapor depositing, doping, planarizing, etching, resist removing, dicing, bonding, and packaging). The article manufacturing method according to the present exemplary embodiment has an advantage over conventional methods in at least one of article performance, quality, productivity, and production cost.

A pattern of a cured object formed by the imprint apparatus is used permanently for at least respective parts of various types of articles or is used temporarily at the time of manufacturing various types of articles. Examples of the articles include an electric circuit element, an optical element, microelectromechanical systems (MEMS), a recording element, a sensor, and a mold. Examples of the electric circuit element include a volatile semiconductor memory and a non-volatile semiconductor memory, specifically, a dynamic random access memory (DRAM), a static random access memory (SRAM), a flash memory, and a magnetoresistive random access memory (MRAM), and a semiconductor element, specifically, a large-scale integrated circuit (LSI), a charge-coupled device (CCD), an image sensor, and a field-programmable gate array (FPGA). Examples of the mold include a mold for imprinting.

The pattern of the cured object is used as at least part of the constituent members in each article above without any change or is temporarily used as a resist mask. After etching or ion implantation in the step of treating the substrate, the resist mask is removed.

Figure 9A:
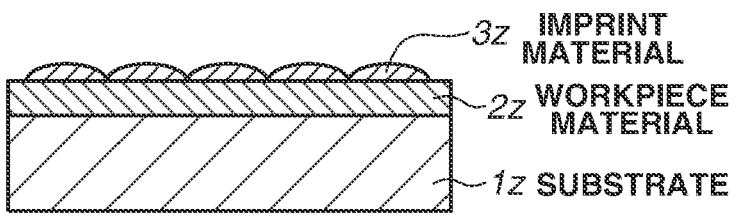
FIGS. 9A, 9B, 9C, 9D, 9E, and 9F are explanatory drawings of an article manufacturing method.

The article manufacturing method will be described. As illustrated in FIG. 9A, prepared is a substrate 1z, such as a silicon substrate, having a surface on which a workpiece material 2z, such as an insulating material, is formed. Then, an imprint material 3R is applied on the surface of the workpiece material 2z, for example, by inkjet coating. Here, a plurality of droplets of the imprint material 3z is applied on the substrate 1z.

Figure 9B:
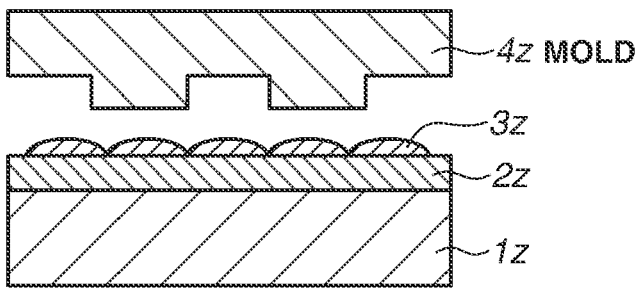
Figure 9C:
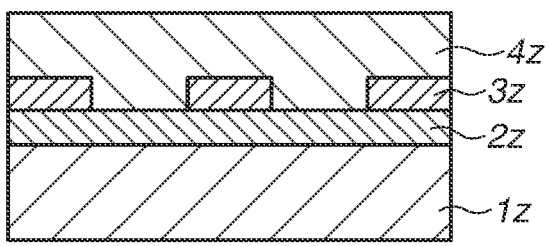

As illustrated in FIG. 9B, a mold 4z for imprinting is opposed such that a surface having a relief pattern faces the imprint material 3z on the substrate 1z. As illustrated in FIG. 9C, the substrate 1z, on which the imprint material 3z has been applied, and the mold 4z are brought in contact with each other, and then pressure is applied. The imprint material 3z is filled into a gap between the mold 4z and the workpiece material 2z. With the state retained, irradiation of light as curing energy through the mold 4z causes the imprint material 3z to be cured.

Figure 9D:
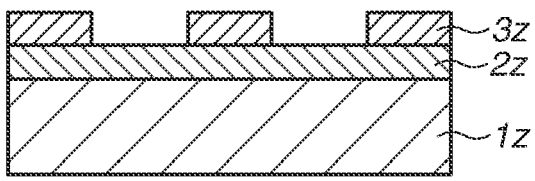

As illustrated in FIG. 9D, after the imprint material 3z has been cured, the mold 4z is separated from the substrate 1z, so that a pattern of a cured object of the imprint material 3z is formed on the substrate 1z. The pattern of the cured object has a shape in which the recessed portion of the cured object corresponds to the protruding portion of the mold 4z and the protruding portion of the cured object corresponds to the recessed portion of the mold 4z. In other words, the imprint material 3z has the relief pattern of the mold 4z transferred thereto.

Figure 9E:
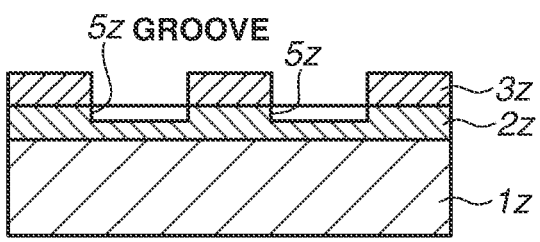
Figure 9F:
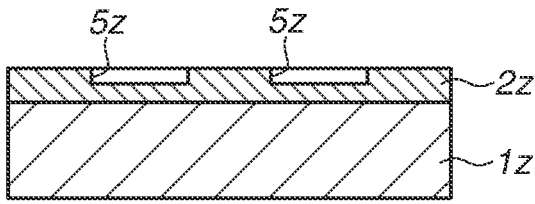

As illustrated in FIG. 9E, etching is performed with the pattern of the cured object as an etching-resistant mold. Then, any portion on which no cured object is present or the cured object remains thinly is removed from the surface of the workpiece material 2z, thereby resulting in acquisition of a groove 5z. As illustrated in FIG. 9F, the pattern of the cured object is removed, so that an article having grooves 5z on the surface of the workpiece material 2z can be acquired. Here, the pattern of the cured object is removed. However, without removal after treatment, a pattern of a cured object can be used as an inter-layer insulating film included in a semiconductor element or the like, namely, as a constituent member of the article.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-107094, filed Jun. 22, 2020, which is hereby incorporated by reference herein in its entirety.

What is claimed is:

1. A pattern forming method of forming, with a mold, a pattern on a substrate held by a substrate holding unit comprising a plurality of holding regions capable of changing a holding force for each holding region of the plurality of holding regions, the pattern forming method comprising:
setting, with a first plurality of shot regions corresponding to a first holding region set as a target for pattern formation, a value of a first holding force in the first holding region at a first value that is smaller than a value of a second holding force in a second holding region different from the first holding region, wherein the plurality of holding regions includes the first holding region and the second holding region;
coating, with an imprint material, a region including the first plurality of shot regions corresponding to the first holding region; and
after coating the region including the first plurality of shot regions with the imprint material, forming instances of the pattern on the substrate by repeatedly bringing the imprint material, with which the first plurality of shot regions corresponding to the first holding region has been coated, and the mold in contact with each other.

2. The pattern forming method according to claim 1, further comprising setting, with the value of the first holding force in the first holding region set in the setting at the first value, the value of the first holding force at a second value larger than the first value, before the forming of the instances of the pattern.

3. The pattern forming method according to claim 2, wherein, in the forming of the instances of the pattern, the mold and the imprint material are separated from each other after setting the value of the first holding force at a third value smaller than the second value.

4. The pattern forming method according to claim 3, wherein, in the forming of the instances of the pattern, the mold and the imprint material are separated from each other while bending the substrate and the mold in mutually opposite directions.

5. The pattern forming method according to claim 1, wherein, in the setting, distortion occurring in the substrate held by the first holding region is released.

6. The pattern forming method according to claim 1, wherein the first holding region and the second holding region are concentrically arranged.

7. The pattern forming method according to claim 1, further comprising:
setting, with a second plurality of shot regions corresponding to the second holding region set as a target for pattern formation, the value of the second holding force in the second holding region at a fifth value that is smaller than the value of the first holding force in the first holding region;
coating, with the imprint material, the second plurality of shot regions corresponding to the second holding region; and
forming instances of the pattern on the substrate by repeatedly bringing the imprint material, with which the second plurality of shot regions corresponding to the second holding region have been coated, and the mold in contact with each other.

8. The pattern forming method according to claim 1, further comprising:
coating, with the imprint material, a second plurality of shot regions corresponding to the second holding region;
setting, with the second plurality of shot regions corresponding to the second holding region coated with the imprint material in the coating and with the plurality of shot regions corresponding to the second holding region set as a target for pattern formation, the value of the second holding force at a sixth value smaller than the value of the first holding force; and
forming instances of the pattern on the substrate, the forming of the instances of the pattern including repeatedly bringing the imprint material with which the second plurality of shot regions corresponding to the second holding region has been coated and the mold in contact with each other.

9. The pattern forming method according to claim 1, wherein the coating includes moving the substrate, and wherein the first plurality of shot regions is arrayed in a first direction in which the substrate is moved in the coating.

10. The pattern forming method according to claim 9, wherein the first plurality of shot regions is arrayed in the first direction and in a second direction perpendicular to the first direction.

11. An article manufacturing method comprising:
forming, with a mold, a pattern on a substrate held by a substrate holding unit capable of changing a holding force for each holding region of a plurality of holding regions, wherein the plurality of holding regions includes a first holding region and a second holding region; and
treating the substrate on which the pattern is formed in the forming the pattern,
wherein the forming the pattern includes:
setting, with a first plurality of shot regions corresponding to the first holding region set as a target for pattern formation, a first holding force in the first holding region to a value that is smaller than a value of a second holding force in a second holding region different from the first holding region;
coating, with an imprint material, a region including the first plurality of shot regions corresponding to the first holding region; and
after coating the region including the first plurality of shot regions with the imprint material, repeatedly bringing the imprint material, with which the first plurality of shot regions corresponding to the first holding region has been coated, and the mold in contact with each other.

* * * * *